United States Patent
Ogasawara et al.

(10) Patent No.: US 6,836,319 B2
(45) Date of Patent: Dec. 28, 2004

(54) OPTICAL SYSTEM ADJUSTING METHOD FOR ENERGY BEAM APPARATUS

(75) Inventors: Munehiro Ogasawara, Kanagawa-ken (JP); Jun Takamatsu, Kanagawa-ken (JP); Hitoshi Sunaoshi, Kanagawa-ken (JP); Naoharu Shimomura, Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 10/819,201

(22) Filed: Apr. 7, 2004

(65) Prior Publication Data

US 2004/0190006 A1 Sep. 30, 2004

Related U.S. Application Data

(62) Division of application No. 10/602,701, filed on Jun. 25, 2003, now Pat. No. 6,781,680, which is a division of application No. 09/533,815, filed on Mar. 24, 2000, now Pat. No. 6,606,149.

(30) Foreign Application Priority Data

Mar. 26, 1999 (JP) .......................................... 11-083934

(51) Int. Cl.[7] .................................................. G01J 1/00
(52) U.S. Cl. ..................... 356/121; 356/618; 250/491.1
(58) Field of Search ................................ 356/121–123, 356/399–400, 614, 500, 618; 250/491.1–491.3, 548

(56) References Cited

U.S. PATENT DOCUMENTS

| 4,199,688 A | 4/1980 | Ozasa |
| 4,376,249 A | 3/1983 | Pfeiffer et al. |
| 4,443,703 A | 4/1984 | Shimazu et al. |
| 4,636,968 A | 1/1987 | Gotou et al. |
| 4,650,983 A | 3/1987 | Suwa |
| 4,808,829 A | 2/1989 | Okumura et al. |
| 5,136,169 A | 8/1992 | Smith et al. |
| 5,285,075 A | 2/1994 | Minamide et al. |
| 5,315,123 A | 5/1994 | Itoh et al. |
| 6,132,910 A | 10/2000 | Kojima |
| 6,583,430 B1 | 6/2003 | Muraki |

OTHER PUBLICATIONS

Goodberlet et al., "Spatial–Phase–Locked Electron–Beam Lithography with a Delay–Locked Loop," J. Vac. Sci. Technol., B (1997), 15:2293–97.

Smith et al., "A New Approach to High Fidelity E–Beam and Ion–Beam Lithography Based on an in situ Global–Fiducial Grid," J. Vac. Sci. Technol., B (1991), 9:2992–95.

Smith et al., "Applicaiton of Moiré Techniques in Scanning–Electron–Beam Lithography and Microscopy," J. Vac. Sci. Technol. (1975), 12:1262–65.

*Primary Examiner*—Hoa Q. Pham
(74) *Attorney, Agent, or Firm*—Finnegan, Henderson, Farabow, Garrett & Dunner, L.L.P.

(57) ABSTRACT

A method for adjusting an optical system of an energy beam apparatus by using a mark signal that is obtained by one-dimensionally or two-dimensionally scanning a mark on a sample with an energy beam. The mark has a one-dimensional or two-dimensional periodic structure. A first mark signal is detected by scanning the mark with a beam. The mark is set on the optical axis of the optical system. A second mark signal is detected by scanning the mark with a beam. The mark is located at a position that is deviated from the optical axis. A deviation of a deflection position is determined based on a phase difference between the first and second mark signals.

6 Claims, 7 Drawing Sheets

PHASE DEVIATION

OPTICAL SYSTEM ADJUSTING METHOD FOR ENERGY BEAM APPARATUS

This is a division of U.S. patent application Ser. No. 10/602,701, filed Jun. 25, 2003, now U.S. Pat. No. 6,781,680, which is a divisional application of U.S. patent application Ser. No. 09/533,815, filed Mar. 24, 2000, now U.S. Pat. No. 6,606,149 B1, issued Aug. 1, 2003, all of which are incorporated herein by reference.

BACKGROUND OF THE INVENTION

1. Field of the Invention

The present invention relates to an optical system adjusting method in an energy beam apparatus, and more particularly, the invention relates to an optical system adjusting method in an electron beam lithography apparatus that is used to form a fine pattern on a wafer.

2. Discussion of the Background

In the electron beam lithography used in recent semiconductor manufacturing processes, to increase the throughput, variable shaping or character projection type electron beam lithography apparatuses are used in which writing is performed by generating a beam having a cross-section of a rectangle, a triangle, or an arbitrary pattern in addition to the circular beam used in previous apparatuses. In this type of apparatus, because of the miniaturization and the increased accuracy of the pattern formation, the beam dimensions and position must be more accurate.

One condition to be satisfied for increasing accuracy in beam dimensions and position is that the optical axis of a beam and the axis of a lens should coincide with each other. For example, this condition is satisfied in a manner shown in FIG. 11, which shows an exemplary beam measurement using a conventional mark. A fine mark 112 is scanned with a beam 111, and a relative positional relationship between a scanning region and the mark 112 is determined based on a resulting reflected electron signal. Adjustments are made by using an alignment coil so that this positional relationship does not vary, even if the degree of lens magnetic excitation is changed.

The accuracy of an electron beam deflection position must also be very high. To correctly control the deflection, a mark position on a stage that is provided with a laser interferometer is determined under a certain deflection condition, and then the deflection condition is determined by moving the mark. A corresponding relationship between the deflection condition and the actual mark position is determined by repeating this operation, to thereby adjust a deflection system so that the deflection position is located at a prescribed position.

A mark may be produced by forming a very small hole in a heavy metal thin film. The signal polarity is inverted at the mark. Further, an inflow current may be measured by using a minute Faraday cup structure as a mark. FIG. 12a shows another exemplary beam measurement using a conventional mark. FIGS. 12b–12c are graphs showing the signal intensity of reflected electron signals. A position is determined based on a signal as shown in FIG. 12b that is obtained by scanning a single mark 122 with a beam 121 as shown in FIG. 12a. The middle of two peak positions may be obtained, for example, by differentiating a mark signal as shown in FIG. 12c.

A signal obtained by scanning a mark with a beam typically includes considerable noise. To eliminate such noise, mark signals are obtained by scanning the mark with a beam many times and superimposing those signals one on another. In this case, it takes a long time to obtain sufficient accuracy. Further, applying a beam to the same location many times causes the mark and its vicinity to be heated locally. The resulting thermal expansion of the mark and the mark substrate may lower the accuracy.

As described above, the conventional method of adjusting the optical axis, the deflection position, the rotation, or the like of an energy beam by using a single mark has various problems, such as failure to obtain sufficiently high adjustment accuracy and the long time required to make adjustments.

SUMMARY OF THE INVENTION

The present invention has been made in view of the above circumstances in the art, and an object of the invention is therefore to provide an optical system adjusting method in an energy beam apparatus which can perform, correctly and in a short time, an optical system adjustment for optimizing the optical axis, the deflection position, or the rotation of an energy beam.

The present invention provides a method for adjusting an optical system of an energy beam apparatus, comprising preparing a mark having a one-dimensional or two-dimensional periodic structure; detecting a mark signal by scanning the mark with an energy beam one-dimensionally or two-dimensionally; and determining a variation in a positional relationship between the mark and a beam scanning region based on a phase variation of the mark signal.

In one aspect, a first mark signal is detected by scanning, with an energy beam, the mark that is set on the optical axis of the optical system. A second mark signal is detected by scanning, with an energy beam, the mark that is located at a position that is deviated from the optical axis of the optical system. A deviation of a deflection position is determined based on a phase difference between the first and second mark signals.

In another aspect, a first mark signal is detected by scanning, with an energy beam, a mark that is set on the optical axis of the optical system. A second mark signal is detected by scanning, with an energy beam, the mark in a state in which a driving condition of a lens that is being axially aligned is changed. A deviation between the energy beam optical axis and the axis of the lens is determined based on a phase difference between the first and second mark signals.

In another aspect, small fields that are smaller than energy beam deflection-test regions are set so that boundaries of adjacent ones of the small fields are in contact with each other. For adjacent small fields, mark signals are detected in an overlap region of deflection-test regions by using marks having the same periodic structure. The optical system is adjusted so that the two mark signals for the adjacent small fields coincide with each other.

In another aspect, a phase deviation of the mark signal is detected based on a phase deviation of a moiré signal that is obtained by calculating the product of the mark signal and a reference signal having a different frequency than the mark signal.

In another aspect, an offset-removed component of the mark signal is binarized. A phase deviation of the mark signal is detected based on a phase difference signal that is obtained by calculating the product of the binarized mark signal and a binarized reference signal having the same frequency as the mark signal and averaging a resulting product signal.

In another aspect, the mark has a two-dimensional periodic structure. A deviation in the rotational direction of a beam deflection region is detected based on a two-dimensional distribution that is obtained based on phase variations of periodic components of a mark signal distribution that correspond to the period(s) of the mark.

In another aspect, the mark has a two-dimensional periodic structure. A second or higher order deviation of a beam deflection region from a designed deflection region is detected based on a two-dimensional distribution that is obtained based on phase variations of periodic components of a mark signal distribution that correspond to the periods of the mark.

In another aspect, a phase deviation of the mark signal based on a phase difference between moiré signals that are obtained for two reference signals that are higher and lower, respectively, in frequency than the mark signal.

In another aspect, a phase deviation of the mark signal is detected based on a phase difference signal that is obtained by calculating the product of the mark signal and a reference signal having the same frequency as the mark signal and averaging a resulting product signal.

In another aspect, the product of the mark signal and the reference signal is obtained by modulating the energy beam intensity at the frequency of the reference signal.

The energy beam may be an electron beam, an ion beam, a neutral particle beam, or a photon beam.

The present invention provides adjustment of, for example, the beam position on a sample correctly in a short time by determining a variation in the positional relationship between a mark and a beam scanning region based on a phase variation of a mark signal, thereby contributing to, for example, an increase of the rate of operation of an energy beam apparatus.

DESCRIPTION OF THE PREFERRED EMBODIMENTS

The present invention is hereinafter described in detail by using illustrated embodiments.

Embodiment 1

Figure 1A:
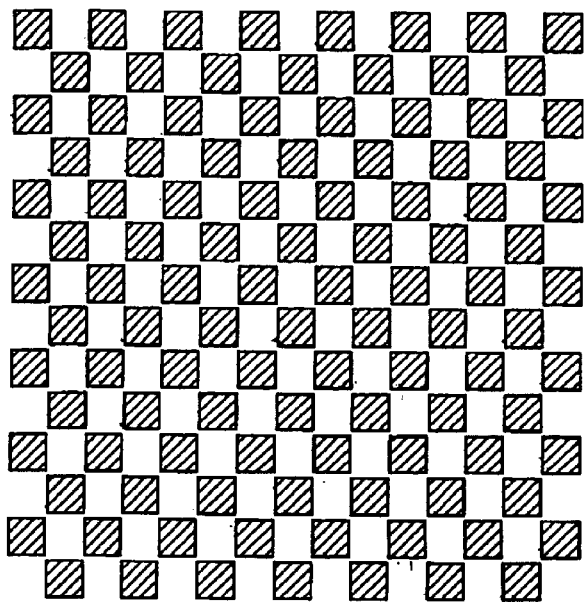
FIGS. 1a–1e show mark patterns that are used in a first embodiment of the present invention.

FIGS. 1a–1e show mark patterns according to a first embodiment of the present invention. In the example of FIG. 1a, a sample having a mark may be a chromium mask in which a conductive film is formed on a chromium light shield film as an undercoat that is formed on a glass substrate. The mark may be produced by etching a chromium light shield film in a checkered pattern having a constant period S. Mark patterns shown in FIGS. 1b–1e can also be used.

Figure 2A:
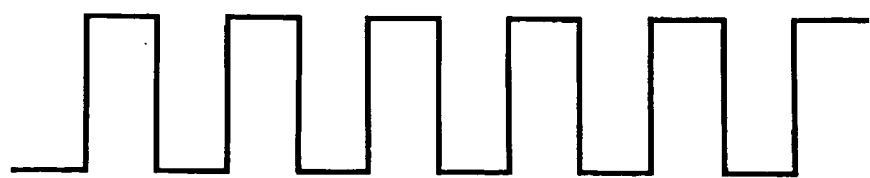
FIGS. 2a and 2b are graphs showing an example of a periodic mark signal and its fundamental-wave component, respectively.
Figure 2B:

Determining a beam position by using the mark shown in FIG. 1a is now described. Although in this example an electron beam is assumed as an energy beam, the energy beam is not limited to an electron beam and may be, for example, light, an ion bean, or a neutral particle beam. A stage that is mounted with a sample is moved so that a beam strikes the center or its vicinity of the mark when the beam is located at an origin (0, 0) of the deflection position. In this state, a reflected electron signal is captured that is obtained when a deflector scans the mark with a beam in the vertical and horizontal directions with a deflector. The resulting signal is periodic in both vertical and horizontal directions, as shown in FIG. 2a. The fundamental component of sinusoidal components of the signal thus obtained is shown in FIG. 2b.

Figure 3A:
FIGS. 3a and 3b are graphs showing the fundamental-wave component of a mark signal and that of a phase-deviated signal, respectively.
Figure 3B:
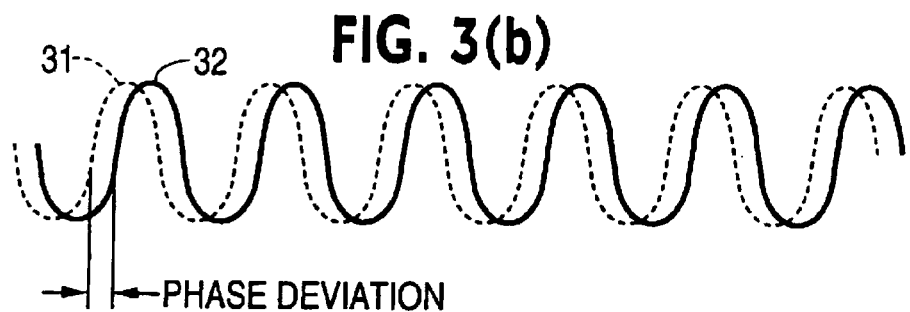

Then, the mark position is moved to a position (x1, y1) by moving the stage. A mark movement distance is measured accurately by a laser interferometer that is provided on the stage. A beam is deflected to the above position, and scanning is performed with a beam in the vertical and horizontal directions with the same widths (the above position is centered) as in the above-case where the mark was located at the origin (0, 0). Referring to FIG. 3a, there is shown a graph of the fundamental-wave component of a mark signal. A sinusoidal component of a signal that is obtained in this state is equal in phase to the signal that was obtained at the origin (0, 0). Referring to FIG. 3b, there is shown a fundamental-wave component of a phase-deviated signal. However, if the deflection position deviates from the desired position even by a small value, a phase deviation occurs between the signals as shown in FIG. 3b. Therefore, a deviation of the deflection position can be measured based on a phase deviation between a first mark signal 31 that is obtained at the origin (0, 0) and a second mark signal 32 that is obtained at the position (x1, y1).

Methods (1-a) to (1-d) described below can be used as a phase deviation detecting method. Since in many cases a mark signal includes an offset value, a signal obtained by subtracting an offset value that is determined in advance from a mark signal is used as a new mark signal. Another desirable measure is to remove a temporally invariable component of a mark signal by causing the mark signal to pass through a capacitor, for example.

Phase Deviation Detecting Method (1-a):

A signal obtained is binarized, that is, converted into a signal having values 0 and 1, to generate a rectangular wave. The product of a binary distribution obtained from a signal at the origin (0, 0) and a binary distribution obtained from a signal at (x1, y1) is calculated and the average value of a resulting distribution is calculated.

Figure 4:
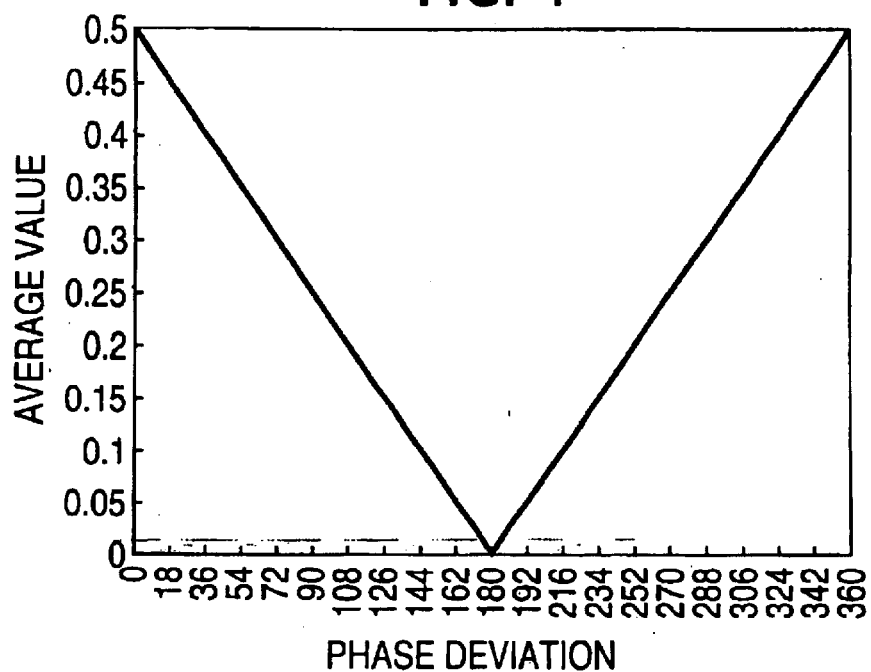
FIG. 4 is a graph showing phase difference dependence of the product of a rectangular-wave mark signal and a reference signal.

FIG. 4 is a graph showing the phase difference dependence of the product of a rectangular-wave signal and a reference signal. If the-phases are exactly equal to each other, the average value is 0.5 as shown in FIG. 4. If the phases are different from each other by 180°, the average value is 0. If the phase difference is between 0° and 180°, the average value is a value between 0 and 0.5. Binarizing a signal increases the phase detection sensitivity. Alternatively, signal values themselves may be used. However, in this case, although the product varies with the phase variation, the average value varies with the offset value and the amplitude.

Phase Deviation Detecting Method (1-b):

A phase component of a signal obtained is detected by subjecting the signal to a Fourier transform in a limited interval, and a variation in the detected phase component is determined. The fundamental component of a signal is now represented by $I \sin(kx+\alpha)$. If it is multiplied by a reference signal $\sin(kx)$ and then averaged over n periods (n: natural number), all of an offset component and harmonic components of the signal become 0, and finally a phase difference signal $0.5 nI \cos \alpha$ is obtained.

Figure 5:
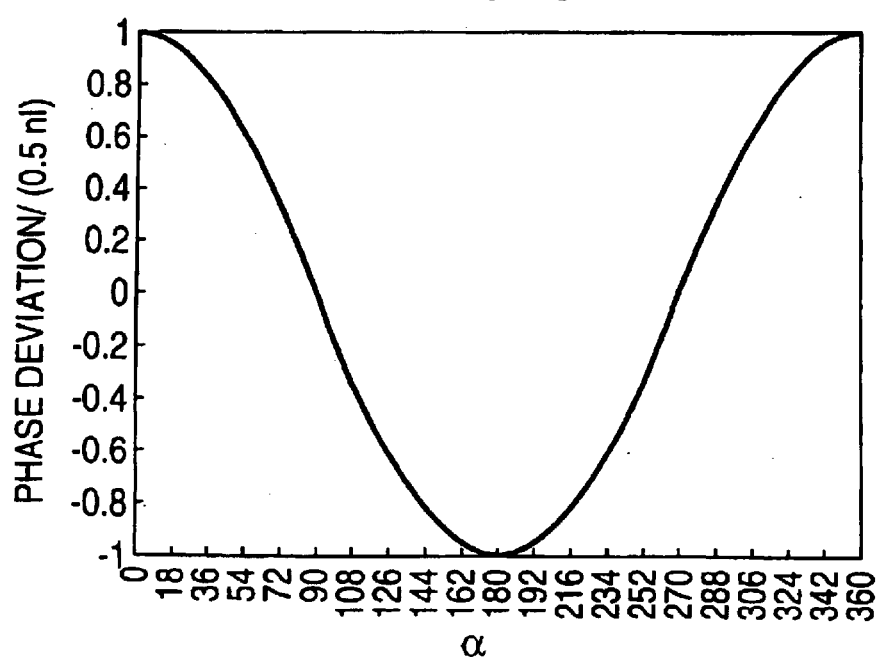
FIG. 5 is a graph showing phase difference dependence of a phase difference signal that is obtained from the product of the fundamental-wave component of a mark signal and a reference signal.

FIG. 5 is a graph showing the variation of the phase difference signal with $\alpha$. A desired beam deflection position is obtained when the phase difference signal is maximized by moving the beam deflection position. A phase difference signal may be directly obtained by modulating the intensity of an energy beam itself and integrating a resulting signal instead of multiplying a mark signal by a reference signal.

Figure 6A:
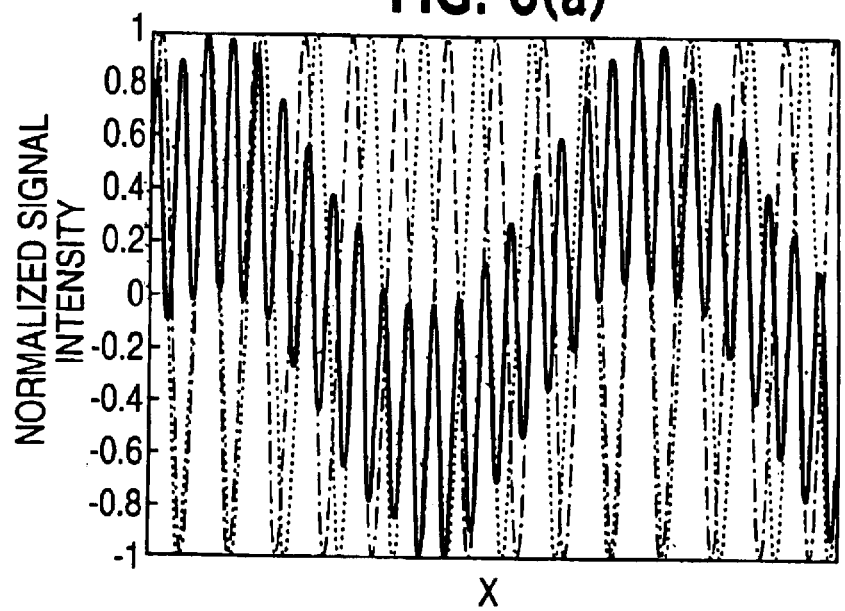
FIG. 6a is a graph showing the intensity of a signal obtained from the product of the fundamental-wave component of a mark signal and a reference signal.
Figure 6B:
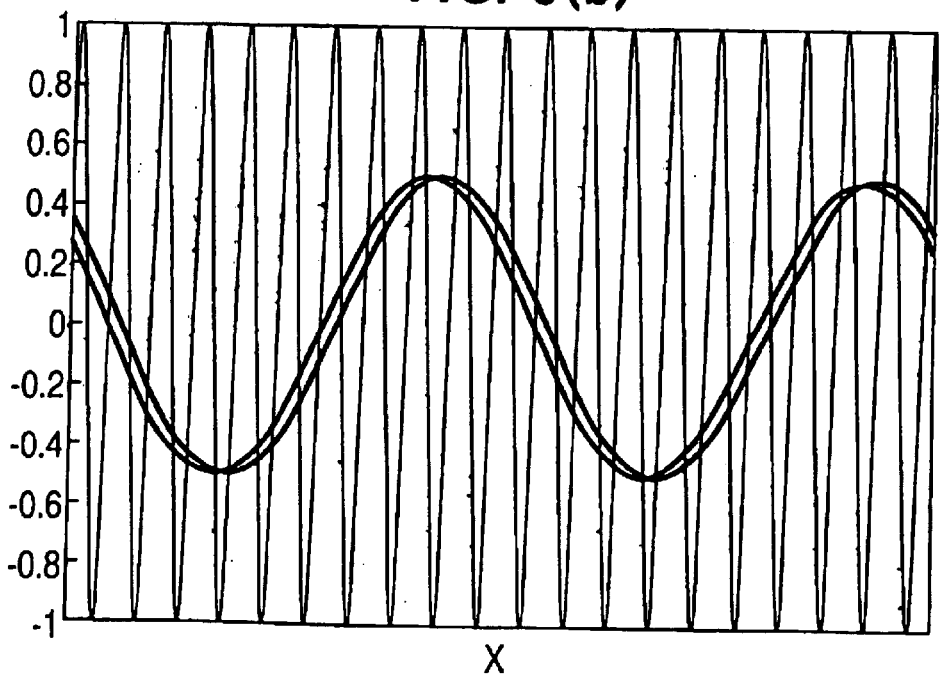
FIG. 6b is a graph showing the intensity of the fundamental-wave components of mark signals obtained at two different points and a corresponding moiré signal.

Phase Deviation Detecting Method (1-c):

FIG. 6a is a graph showing the intensity of a signal obtained from the product of the fundamental-wave component of a mark signal and a reference signal. FIG. 6b is a graph showing the intensity of the fundamental-wave components of mark signals obtained at two different points and a corresponding moiré signal. The fundamental component of a signal obtained is now represented by $I \sin(kx+\alpha)$. As shown in FIG. 6a, if the fundamental component is multiplied by a reference signal $\sin(k'x)$ that is slightly deviated in frequency, a resulting signal is given by $$0.5 I \cos\{(k-k')x+\alpha\} - 0.5 I \cos\{(k+k')x+\alpha\}.$$

As for the first term, values of x that give the same phase are deviated from each other by $-\Delta\alpha/(k-k')$ for a variation $\Delta\alpha$ of the phase difference $\alpha$. Now assume that the first term is a new signal (moiré signal). Then, as shown in FIG. 6B, its phase deviation is $k/(k-k')$ times larger than the phase deviation of the original signal. Although the sign of $k/(k-k')$ varies with the magnitude relationship between k and k', in the following description the magnification factor is assumed to be an absolute value unless otherwise specified. A desired beam deflection position is obtained by adjusting the beam deflection position so that the phase variation between moiré signals at the origin (0, 0) and the position (x1, y1) is minimized.

Next, the second term is considered. For a subject value of x, averaging is performed over a range of x−L/2 to x+L/2 where L satisfies $(k-k')L=(2n-1)\pi$ (n: integer).

With exception of the common coefficient 0.5 nI, $$\begin{aligned}
\text{(average value of first term)} &= (1/L)\int \cos\{(k-k')x+\alpha\}dx \\
&= \{1/L(k-k')\}[\sin\{(k-k')L/2+(k-k')x+\alpha\} - \\
&\quad \sin\{-(k-k')L/2+(k-k')x+\alpha\}] \\
&= \{1/L(k-k')\}[\cos\{(k-k')x+\alpha\} + \\
&\quad \cos\{(k-k')x+\alpha\}] \\
&= (2/\pi)\cos\{(k-k')x+\alpha\}.
\end{aligned}$$

$$\begin{aligned}
\text{(Average value of second term)} &= (1/L)\int \cos\{(k+k')x+\alpha\}dx \\
&= \{1/L(k+k')\}[\sin\{(k+k')L/2+(k+k')x+\alpha\} - \\
&\quad \sin\{-(k+k')L/2+(k+k')x+\alpha\}] \\
&= \{1/L(k+k')\}[\sin\{kL+(-k+k')L/2+ \\
&\quad (k+k')x+\alpha\} - \sin\{-kL-(-k+k')L/2+ \\
&\quad (k+k')x+\alpha\}] \\
&= \{1/L(k+k')\}[-\cos\{kL+(k+k')x+\alpha\} + \\
&\quad \cos\{-kL+(k+k')x+\alpha\}] \\
&= \{2/L(k+k')\}\sin\{(k+k')x+\alpha\}\sin(kL).
\end{aligned}$$

In the above equations, each integral is calculated from a lower limit x−L/2 to an upper limit x+L/2.

Therefore, the average value of the second term becomes 0 if $kL=2 m\pi$ (m: natural number). As is apparent from the two conditions $(k-k')L=(2n-1)\pi$, and $kL=2 m\pi$, it is desirable that k' and L be determined so as to satisfy $kL=2m\pi, (k-k')L=\pm\pi.$ For example, if m=5 and k−k'=π/L, $k/(k-k')=10$ is obtained.

Since the average value of the second term decreases approximately in inverse proportion to kL, it is desirable that m be a large value. Although an offset value may be removed in advance from a mark signal, it is removed in the above process of obtaining a moiré signal and the desirable condition in the above averaging process. Further, high-frequency noise components are removed by the above averaging process.

A signal $0.5 I[ \cos \{(k-k')x+\alpha\} - \cos \{(k+k')x+\alpha\}]$ may be obtained by modulating the intensity of an energy beam itself so that the variation component of a mark signal that is obtained when a mark having uniform reflectance is scanned with a beam becomes $I \sin(k'x)$. This process may be used instead of calculating the product of a mark signal and a reference signal that is incorporated in the apparatus. In this case, it may be desirable to remove a temporally invariable constant at the time of obtaining a signal because an offset component remains even after the averaging process.

Figure 7:
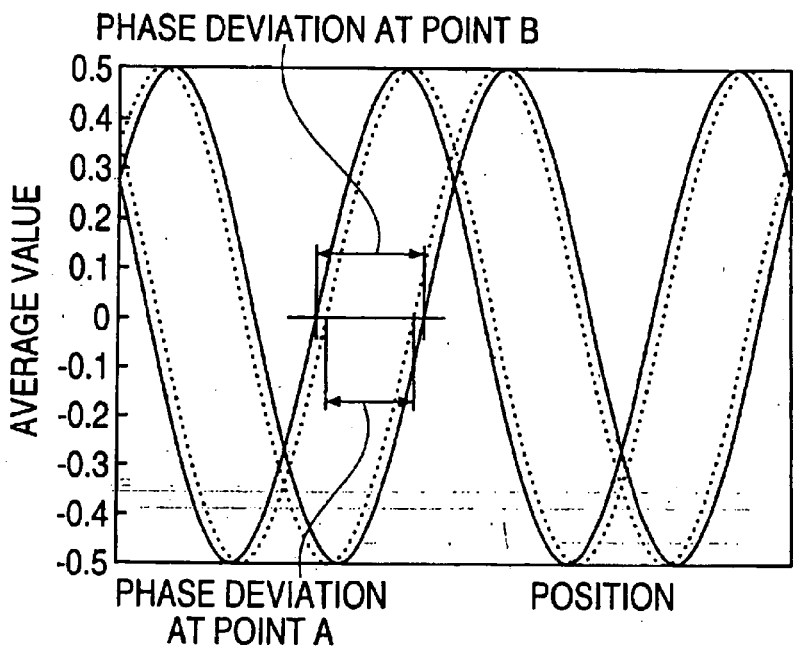
FIG. 7 is a graph showing moiré signals obtained by using reference signals that are higher and lower in frequency than the fundamental-wave component of a mark signal.

Phase Deviation Detecting Method (1-d):

FIG. 7 is a graph showing the moiré signals obtained by using reference signals that are higher and lower in frequency than the fundamental-wave component of a mark signal. The fundamental component of a signal obtained is now represented by I sin(kx+α). It is multiplied by reference signals sin(k'x) and sin(k"x) that are slightly higher and lower, respectively, in frequency than the fundamental component, whereby moiré signals are obtained for the respective reference signals. Moiré signals are extracted in the same manner as in the method (1-c). If a variation between a phase difference between the two moiré signals at point A and that at point B is determined as shown in FIG. 7, this variation is larger than a phase variation obtained by the method (1-c).

If the absolute values of the two phase differences obtained in the above manner are made equal to each other, then k can be determined with high accuracy because k' and k" can be determined with high accuracy. A desired beam deflection position is obtained by adjusting the beam deflection position so that the phase differences of moiré signals at the origin (0, 0) and the position (x1, y1) are made equal to each other.

Beam deflection positions are examined at different mark positions by repeating one or more of the above-described methods, and adjustments are so made that the beam deflection positions fall within an allowable range for a desirable value. This enables highly accurate control of the beam deflection position.

Embodiment 2

This embodiment relates to alignment of the beam optical axis and the lens axis. First, the mark that has been described in the first embodiment is moved to the origin (0, 0) of the deflection position. At this position, a signal is obtained by scanning a beam in both vertical and horizontal directions. Then, another signal is obtained in a similar manner after changing the focal length of a lens that is to be axially aligned by changing an excitation magnetic or electric field for the lens by a very small amount.

Then, a change of the beam position on the stage position is detected based on the thus-obtained two signals according to any of the detection methods described in the first embodiment. The axes of the lens and a beam are aligned with each other by adjusting an axial alignment coil or electrode so that the change of the beam position is minimized when the lens focal length is varied around a set value.

If a fluctuation of the beam position has been measured by another technique based on a moiré signal that was obtained with a constant lens focal length, a fluctuation of the stage position may also be determined.

Embodiment 3

This embodiment relates to alignment of the coordinate axes of beam deflection and those of a mark. First, a two-dimensional image of a checkered mark having approximately the same area as a beam deflection region is obtained by deflecting a beam with the center of the mark used as the origin. The angular spatial frequency is represented by the term "k."

Figure 8:
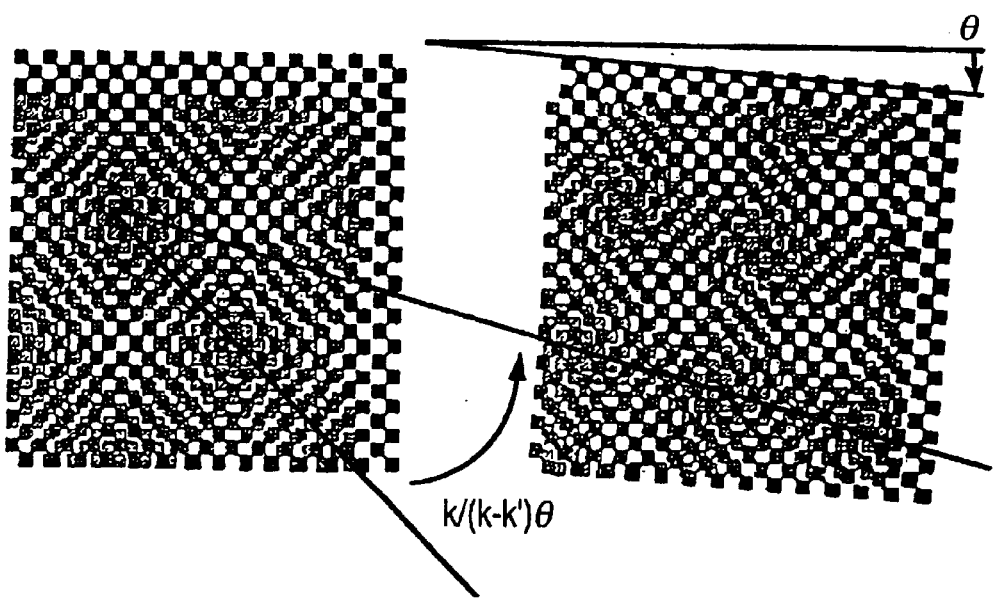
FIG. 8 shows how a two-dimensional moiré signal varies as mark scanning is rotated.

FIG. 8 shows the variation of a two-dimensional moiré signal as the mark scanning is rotated. Now assume that the coordinate axes of the beam deflection is rotated by an angle θ from those of the mark. If a moiré signal is displayed two-dimensionally with an assumption that the angular spatial frequency of a reference signal is k' in both axes, the moiré signal rotates by $k/(k-k')\theta$ when θ is small. Therefore, a rotation of the axes can be detected easily.

If two moiré signals are determined by using two reference signals in which k'<k and k">k, an angular deviation between the two moiré signals is approximately given by $[(k'-k")/\{(k-k')(k-k")\}]\theta$. If k and k' are so determined that $k/(k-k')\theta$ becomes equal to $k/(k"-k)\theta$, the angular deviation is given by $\{(k'+k")/\Delta k\}\theta$ where $\Delta k=k-k'=k"-k$ and can be determined with high accuracy. As θ increases, the frequency of a mark signal increases, and hence the period of the moiré signals becomes shorter. The period of the moiré signals is longest when θ=0.

As another embodiment, the period of a moiré signal may be measured, and adjustments made so that the period of the moiré signal becomes longest. The pitch of two-dimensional scanning with a beam may be set to approximately an integral multiple of the period of a periodic mark, and a positional deviation may be detected along each scanning line.

Embodiment 4

A two-dimensional image of a checkered mark having approximately the same area as a beam deflection region is obtained by deflecting a beam with the center of the mark used as the origin. The angular spatial frequency is represented by the term "k." Now assume that an actual beam deflection position (X, Y) is deviated from a desired position (x, y) by (ΔX, ΔY), that is, X=x+ΔX and Y=y+ΔY. Consideration is made of a case where characteristic lengths of distributions of ΔX and ΔY are sufficiently longer than the wavelength of a moiré signal.

Intersections of lines where a two-dimensional moiré signal is maximum are now called moiré signal lattice points. Alternatively, moiré signal lattice points may be defined as intersections of lines where a two-dimensional moiré signal is minimum or points where the signal is 0. Consideration is now given to a distribution of lattice point positions in a two-dimensional moiré signal. The angular spatial frequency of an ideal moiré signal is represented by Δk and the angular spatial frequency of a reference signal is represented by k. It is assumed that a lattice point corresponding to one two-dimensional moiré signal lattice point (x1, y1) in a case where ΔX=0 and ΔY=0 are satisfied at every point is moved to (x1+dX1, y1+dY1) on the two-dimensional moiré signal.

Let $k_x$ and $k_y$ represent angular spatial frequencies of a mark signal in the x-direction and the y-direction in the vicinity of a measurement point and k' represent an angular spatial frequency of the reference signal in each of the x-direction and the y-direction. Then, ΔX and ΔY are given as follows:

$$\Delta X = -dX1(k_x-k')/k_x$$

$$\Delta Y = -dY1(k_y-k')/k_y$$

Since lattice point positions can be changed by changing the phase of the reference signal, (ΔX, ΔY) distributions can be obtained easily.

Deflection parameters are adjusted based on the thus-obtained (ΔX, ΔY) distributions so that the deviation between the actual deflection position (X, Y) and the desired position (x, y) is within an allowable range in the entire deflection region. Specifically, a correction of (−ΔX, −ΔY) is made for the desired deflection position (x, y) with an assumption that, for example, ΔX and ΔY are given as follows:

$$\Delta X = a1 \cdot x + b1 \cdot y + c1 \cdot x \cdot x + d1 \cdot x \cdot y + e1 \cdot y \cdot y$$

$$\Delta Y = a2 \cdot x + b2 \cdot y + c2 \cdot x \cdot x + d2 \cdot x \cdot y + e2 \cdot y \cdot y$$

Accordingly, the beam deflection position may be controlled with high accuracy.

Embodiment 5

This embodiment relates to a method for adjusting the deflection position in each field to connect adjacent fields.

Figure 9:
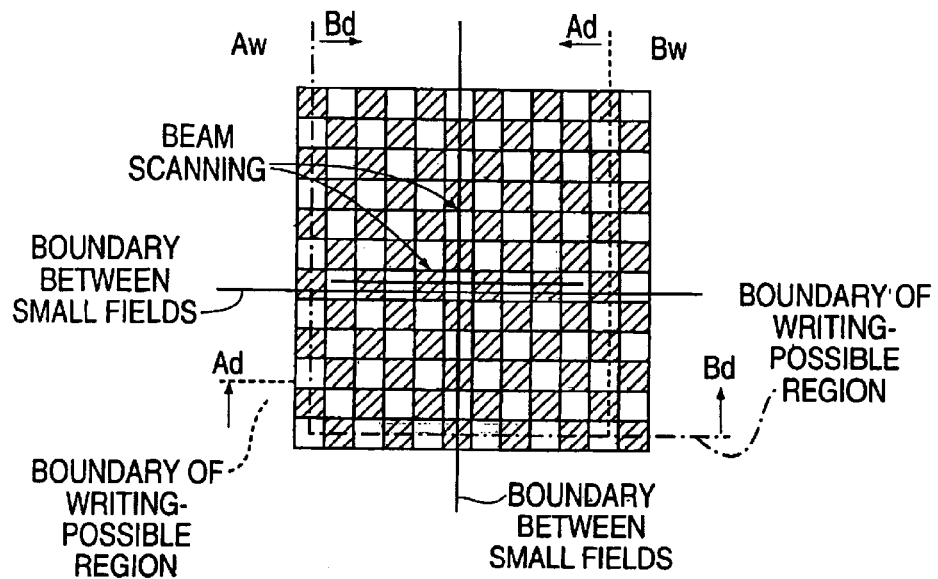
FIG. 9 is a schematic view showing an adjusting method for beam connection in an overlap region of deflection-possible regions for adjacent small regions.

FIG. 9 is a schematic view showing an overlap region of deflection-possible regions for adjacent small regions. Adjacent small fields on a sample are denoted by Aw and Bw, and electron beam deflection regions corresponding to the small fields Aw and Bw are denoted by Ad and Bd, respectively. The deflection regions Ad and Bd have an overlap region AB. A two-dimensional mark is disposed in the overlap region AB as shown in FIG. 9. While electron beam deflection is performed in the region Ad, the region AB is scanned with the beam in the x-direction and the y-direction, and moiré signals M1x and M1y are obtained based on a resulting mark signal.

On the other hand, while electron beam deflection is performed in the region Bd, the region AB is scanned with the beam in the x-direction and the y-direction and moiré signals M2x and M2y are obtained based on a resulting mark signal. If the beam deflection is so adjusted that the moiré signals M1x and M2x are equalized in phase and the moiré signals M1y and M2y are equalized in phase, the beam deflection positions coincide with each other at the boundary between the writing fields Aw and Bw. In this manner, the writing fields Aw and Bw can be connected to each other smoothly.

Of course, adjustments may be made so that two-dimensional moiré signals that are obtained by two-dimensionally scanning a mark coincide with each other, instead of scanning a mark in two directions.

Embodiment 6

This embodiment relates to a method for adjusting the beam deflection width accurately. Consideration is given to a variable shaping beam or a character beam. In a state in which a small mark is placed on a sample, a beam shape is measured first. Then, a one-dimensional or two-dimensional mark that has been formed accurately in advance is scanned with a beam.

It is assumed that the period of the mark is determined correctly. For example, if the pitch of the mark is 1 $\mu$m and the beam deflection width is 10 $\mu$m, nine pulses are obtained by one beam scan. The number of pulses varies with the beam deflection width. That is, the signal period varies with the beam deflection width. By utilizing this fact, the beam deflection width is adjusted and the beam application positions are determined accurately.

Specifically, the signal period is determined correctly according to, for example, the method (1-d) that was described in the first embodiment. The absolute value of the beam deflection distance is determined by comparing the thus-determined signal period with a mark period that has been measured in advance. Positions between consecutive shots are determined based on this deflection distance and a measured beam shape. Accordingly, consecutive beam application positions may be determined correctly.

Embodiment 7

In writing apparatuses, to increase the writing speed, it is desirable that writing be performed while a stage that is mounted with a sample is moved continuously. For this purpose, a beam is moved so that it remains applied to the same positions on a sample by correctly measuring positions on a moving sample stage with a laser interferometer, for example. This is called tracking. The method of the present invention also makes it possible to perform a tracking adjustment with high accuracy.

Figure 10:
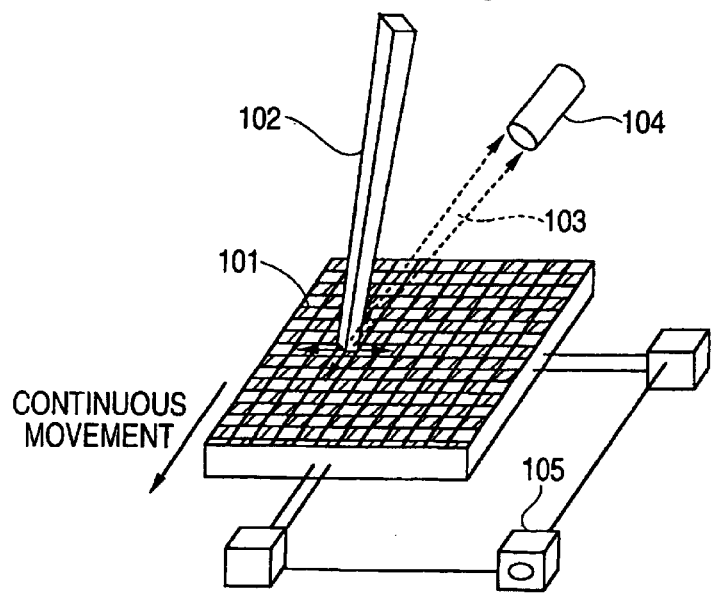
FIG. 10 is a schematic view showing a tracking adjustment for a stage that is moved continuously.
Figure 11:
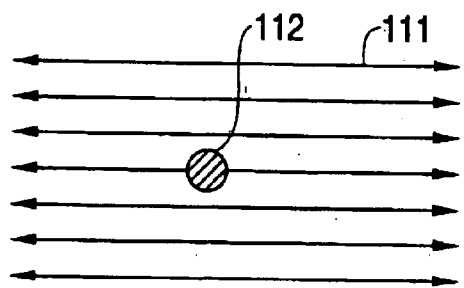
FIG. 11 shows an exemplary beam measurement using a conventional mark.
Figure 12A:
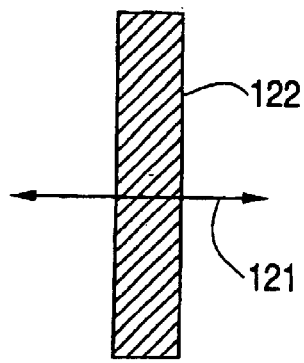
FIG. 12a—shows another exemplary beam measurement using a conventional mark.
Figure 12B:
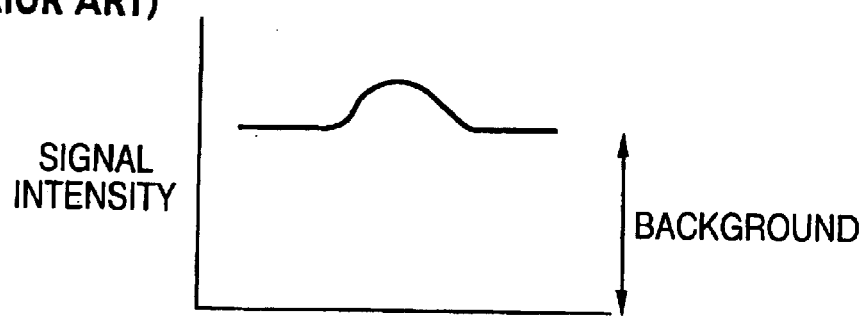
FIGS. 12b–12c are graphs showing the signal intensity of reflected electron signals using a conventional mark.
Figure 12C:
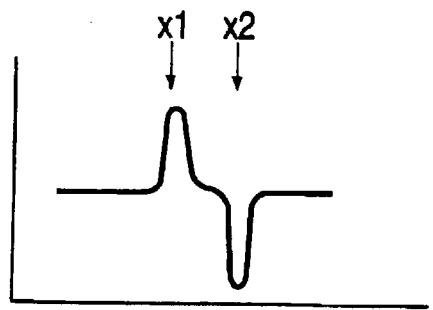

FIG. 10 is a schematic view illustrating a tracking adjustment for a stage that is moved continuously. A lattice-shaped mark 101 is provided on a stage and is two-dimensionally scanned with a beam 102, in a cruciform-like manner, or one-directionally along a movement direction. Reflected electrons 103 coming from the mark 101 are detected by an electron detector 104. At this time, if the beam scanning region and the mark are relatively deviated from each other, a deviation is detected in the phase of a moiré signal. Therefore, a beam deflection adjustment is performed so that a phase shift of the moiré signal is in a small, allowable range.

Conversely, it is possible to detect a fluctuation of the stage measurement accuracy and a fluctuation of the deflection distance, based on the relationship between a deflection control signal and the stage position that is measured by the laser interferometer 105 and a phase variation of a moiré signal.

The present invention is not limited to the above-described embodiments. The above embodiments are mainly directed to the methods for measuring a deviation in the positional relationship between a beam deflection region and a mark. However, in the case of the method (1-b) of the first embodiment, if the size of a beam deflection region on a mark is deviated from a prescribed value, the frequency of a measured mark signal deviates from a prescribed value k. Therefore, when the mark is manufactured with a necessary accuracy, it is desirable that the size of the deflection region be so set that the angular spatial frequency of the mark signal becomes the prescribed value k.

Also in the case of the method (1-c) of the first embodiment, the frequency of a moiré signal similarly deviates from a prescribed value. Therefore, the size of a deflection region of a beam for scanning of a mark can be adjusted by determining the size of the deflection region so that the frequency of a moiré signal becomes a prescribed value.

Figure 1B:
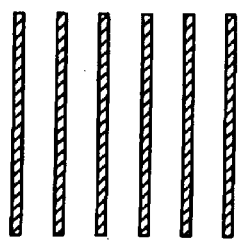
Figure 1D:
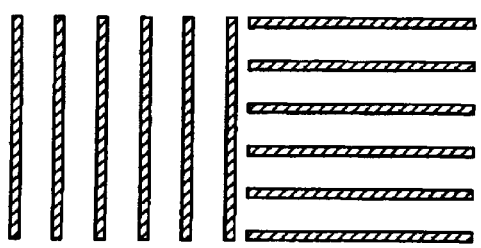
Figure 1C:
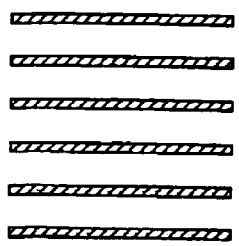
Figure 1E:
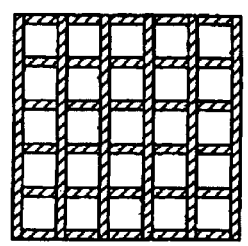

Although the above embodiments are directed to the case of using a checkered mark, the present invention is not limited to such a case. For example, as shown in FIGS. 1b and 1c, a one-dimensional line-and-space mark can be used for one-dimensional positioning. Instead of using a checkered mark, line-and-space marks in the x-direction and the y-direction may be provided perpendicularly to each other as shown in FIGS. 1d and 1e. A beam position may be measured by providing line-and-space marks in the x-direction and the y-direction. A mark may even be formed by arranging triangular or hexagonal units, for example. A mark preferably has a periodic structure in a measurement direction.

The present invention is not limited to the electron beam lithography apparatus, and can be applied to adjustment of optical systems of various kinds of energy beam apparatuses. That is, the energy beam is not limited to an electron beam, and may be an ion beam, a neutral particle beam, or a photon beam. The present invention can be modified in other various ways without departing from the sprit and scope of the invention.

As described above, the present invention allows an optical system to be adjusted, correctly and in a short time, for optimizing the optical axis, the deflection position, the rotation, or the like of an energy beam by determining a variation in the positional relationship between a mark and a beam scanning region based on a phase variation of a mark signal, thereby contributing to, for example, an increase of the rate of operation of various kinds of energy beam apparatuses.

What is claimed is:

1. A method for adjusting an optical system of an energy beam apparatus, comprising:

preparing a mark having a one-dimensional or two-dimensional periodic structure;

detecting a first mark signal by scanning said mark with an energy beam, said mark being set on an optical axis of said optical system;

detecting a second mark signal by scanning said mark with an energy beam, said mark being in a state for changing a driving condition of a lens to be axially aligned; and determining a deviation between an energy beam optical axis and an axis of said lens based on a phase deviation between said first and second mark signals.

2. A method for adjusting an optical system of an energy beam apparatus according to claim 1, further comprising detecting said phase deviation of said first and second mark signals based on a phase deviation of moiré signals of said first and second mark signal that are obtained by calculating said first and second mark signals and a reference signal having a different frequency than said first and second mark signals.

3. A method for adjusting an optical system of an energy beam apparatus according to claim 2, in which said moiré signals are obtained for two reference signals that are higher and lower, respectively, in frequency than said first and second mark signals.

4. A method for adjusting an optical system of an energy beam apparatus according to claim 1, further comprising:

binarizing an offset-removed component of said first and second mark signals; and detecting a phase deviation of said first and second mark signals based on a phase deviation signal that is obtained by calculating a product of said first and second binarized mark signals and averaging a resulting product signal.

5. A method for adjusting an optical system of an energy beam apparatus according to claim 1, further comprising:

detecting a phase deviation of said first and second mark signals based on a phase deviation signal that is obtained by calculating a product of said first and second mark signals and averaging a resulting product signal.

6. A computer useable medium for causing an optical system to execute the method of claim 1.

* * * * *